(12) United States Patent
Busani et al.

(10) Patent No.: US 10,840,092 B2
(45) Date of Patent: Nov. 17, 2020

(54) ATOMIC FORCE MICROSCOPY BASED ON NANOWIRE TIPS FOR HIGH ASPECT RATIO NANOSCALE METROLOGY/CONFOCAL MICROSCOPY

(71) Applicant: UNM RAINFOREST INNOVATIONS, Albuquerque, NM (US)

(72) Inventors: Tito Busani, Albuquerque, NM (US); Steven R. J. Brueck, Albuquerque, NM (US); Daniel Feezell, Albuquerque, NM (US); Mahmoud Behzadirad, Albuquerque, NM (US)

(*) Notice: Subject to any disclaimer, the term of this patent is extended or adjusted under 35 U.S.C. 154(b) by 0 days.

(21) Appl. No.: 16/349,918

(22) PCT Filed: Nov. 29, 2017

(86) PCT No.: PCT/US2017/063754
§ 371 (c)(1),
(2) Date: May 14, 2019

(87) PCT Pub. No.: WO2018/102439
PCT Pub. Date: Jun. 7, 2018

(65) Prior Publication Data
US 2020/0185219 A1    Jun. 11, 2020

Related U.S. Application Data

(60) Provisional application No. 62/427,363, filed on Nov. 29, 2016.

(51) Int. Cl.
*H01L 21/02* (2006.01)
*G01Q 70/12* (2010.01)
*G01Q 60/38* (2010.01)

(52) U.S. Cl.
CPC ....... *H01L 21/02603* (2013.01); *G01Q 60/38* (2013.01); *G01Q 70/12* (2013.01);
(Continued)

(58) Field of Classification Search
CPC ......... H01L 21/02603; H01L 21/02458; H01L 21/0262; H01L 21/02645; G01G 60/38; G01G 70/12
See application file for complete search history.

(56) References Cited

U.S. PATENT DOCUMENTS

| | | |
|---|---|---|
| 2003/0010100 A1 | 1/2003 | Nakayama et al. |
| 2005/0017171 A1 | 1/2005 | Samuelson et al. |

(Continued)

FOREIGN PATENT DOCUMENTS

| | | |
|---|---|---|
| CN | 105510640 A | 4/2016 |

OTHER PUBLICATIONS

Shanova, O. (Authorized PCT officer), Notification of Transmittal of the International Search Report and the Written Opinion of the International Searching Authority, or the Declaration dated Mar. 29, 2018, 10 pages.

*Primary Examiner* — Nicole M Ippolito
*Assistant Examiner* — Hanway Chang
(74) *Attorney, Agent, or Firm* — MH2 Technology Law Group LLP

(57) ABSTRACT

Nanowires that may be utilized in microscopy, for example atomic force microscopy (AFM), as part of an AFM probe, as well as for other uses, are disclosed. The nanowires may be formed from a Group III nitride such as an epitaxial layer that may be or include gallium nitride, indium nitride, aluminum nitride, and an alloy of these materials. During use of the AFM probe to measure a topography of a test sample surface, the nanowire can activated and caused to lase and emit a light, thereby illuminating the surface with (Continued)

the light. In an implementation, the light can be collected by the AFM probe itself, for example through an optical fiber to which the nanowire is attached.

27 Claims, 10 Drawing Sheets

(52) U.S. Cl.
CPC .... *H01L 21/0262* (2013.01); *H01L 21/02458* (2013.01); *H01L 21/02645* (2013.01)

(56) References Cited

U.S. PATENT DOCUMENTS

| | | |
|---|---|---|
| 2010/0132080 A1 | 5/2010 | Kim et al. |
| 2013/0019351 A1 | 1/2013 | Cohen et al. | ary
ATOMIC FORCE MICROSCOPY BASED ON NANOWIRE TIPS FOR HIGH ASPECT RATIO NANOSCALE METROLOGY/CONFOCAL MICROSCOPY

PRIORITY

This application is a U.S. National Phase application of PCT/US2017/063754 filed Nov. 29, 2017, which claims the benefit of U.S. Provisional Application No. 62/427,363, filed Nov. 29, 2016, the entireties of which are incorporated herein by reference.

GOVERNMENT SUPPORT STATEMENT

The UNM portion of this work was supported by the National Science Foundation under cooperative agreement EEC-1160494. UNM is funded under a subcontract from UT-Austin (NASCENT Engineering Research Center). The US government has certain rights in the invention.

TECHNICAL FIELD

This invention relates generally to the field of atomic-force microscopy and near-field optical atomic force microscopy and, more particularly, to atomic force microscopy probes and their manufacture.

BACKGROUND

Scanning probe microscopy constitutes a family of advanced techniques for surface analysis. Although scanning tunneling microscopy (STM) was invented first, the current progress in scanning probe microscopy of polymers, metals, semiconductive and insulating materials largely stems from the development of atomic force microscopy (AFM), which has been recognized by semiconductor industry and material science in general to be a powerful device to obtain information of material surface structures at the nanoscale. It is used for measuring not only inorganic materials such as metals and semiconductors but also organic materials and biomaterials. Also by applying the technology of AFM to microscopy, new functions, such as a magnetic force microscopy (MFM) and a scanning near-field optical microscopy (SNOM) and Raman Enhanced Atomic Force Microscopy (REAFM) are put to practical use.

The universal character of the repulsive forces between the tip and the sample, which is employed for surface analysis in AFM, enables the examination of a practically unlimited range of materials. Initially introduced as the analogue of STM for the high-resolution profiling of non-conducting surfaces, AFM has developed into a multifunctional technique suitable for characterization of topography, adhesion, mechanical, and other properties on scales from hundreds of microns to nanometers and even down to the atomic scale.

In the atomic force microscope, the sample surface is scanned with a probe consisting of a miniature cantilever and a sharp tip. The tip apex is in continuous contact with the surface when imaging is performed in AFM contact mode, or it is in intermittent contact with the sample in the tapping mode.

Although AFM was introduced for high-resolution surface profilometry, the height image records the surface topography exactly only when the tip-to sample force is too small to deform the surface and the forces transverse to the tip are too small to displace (bend) the tip. A priori, it is difficult to determine whether the tip-to-sample force is small enough not to induce surface deformation or to displace (bend) the tip. Therefore the need to avoid surface damage was one of major motivations for the development of the tapping mode, a popular AFM technique. In this mode, short, intermittent contacts between the tip and the surface minimize the inelastic deformation of the sample. Numerous examples confirmed that the effective forces experienced by the sample in the tapping mode are smaller than in the contact mode. Due to the different mechanism involved in measuring samples in contact and in tapping modes, the cantilever and the tip are designed differently for the two modes of operation. For example the lateral resolution of AFM is mainly determined by the shape and physical properties of the probe tip, especially the geometry and dimensions of the probe end. A conventional AFM probe is micro-fabricated in a pyramidal shape. Using conventional pyramidal or conical shaped tips results in image resolution degradation by severe probe broadening effects. This is especially critical for structures with significant topology deviating from a simple planar surface.

Traditional AFM also has been integrated with an external laser to probe photo physical processes, and inter- and intra-molecular forces. However there are several drawbacks in combining confocal microscopy with AFM, mainly due to the difficulty of alignment of the external optical sources given the tight coupling between the tip and the sample surface, adding complexity to the measurements and also adding cost as a result of the expensive instrumentation.

Traditionally, two methods have been used to increase the resolution and longevity of the probe, which also serve to decrease forces between the probe and the sample and extends the AFM application fields. The first method is to sharpen a commercially available silicon (Si) tip using a gallium-based Focused Ion Beam (FIB), while the second method is to attach or grow a carbon nanotube (CNT) to an existing AFM Si tip. There remain issues with both of these approaches. Sharpening the Si tip leads to a complex tip shape that impacts the measurements which ultimately are a convolution of the tip and sample shapes. CNT tips are flexible and the interaction with the samples is complex and nonlinear, exhibiting hysteresis as the tip flexes in response to physical contact with the sample.

While the demand for accurate measurement of optoelectronic properties in local area of materials and devices has been increasing, particularly in the areas of nanometrology and surface engineering, current Atomic Force Microscopy (AFM) probes suffer from several drawbacks. Fabrication of probes including carbon nanotubes (CNTs) have a high manufacturing cost and poor reproducibility and controllability. Further, the accuracy of CNT probes for use with high aspect ratio, nearly vertical walls is complex and requires additional techniques to confirm the interpretation of the resulting measurement data because of the poor transverse stiffness of CNT probes. Artifacts are commonly generated during the imaging and processing. Further, tips fabricated using focused ion beam (FIB) technology require expensive instruments such as a dual beam (electron and ion beam) system (typically referred to as crossbeam), highly skilled operators and single tip processing, and are thus very expensive to fabricate. Large-scale manufacturing of such tips in production quantities is not feasible, in part, because of typically low manufacturing yields.

Thus there is a need for improved high-stiffness tips. Additional functionality such as optical emission and col-

SUMMARY

The following presents a simplified summary in order to provide a basic understanding of some aspects of one or more implementations of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an implementation, a method for forming a probe for measuring a test sample during microscopy includes providing a seed layer on a substrate, wherein the seed layer includes an epitaxial layer, forming a patterned growth mask layer having a hole therein that exposes the seed layer, exposing the seed layer to an epitaxial growth environment, thereby growing a nanowire that extends away from the substrate through the hole, and providing the nanowire on a flat surface of a cantilever head of a cantilever, wherein the cantilever and the nanowire are part of the probe for measuring the test sample during microscopy. Optionally, the method can further include removing the nanowire from the substrate and securing the nanowire to the cantilever head using an electron beam as a localized energy source to form a platinum weld wherein, subsequent to the securing of the nanowire to the cantilever head, the platinum weld physically contacts the nanowire and the flat surface. Additionally, the method can include inserting a first end of the nanowire into a cavity within the flat surface of the cantilever head prior to the securing of the nanowire to the cantilever head using the electron beam.

In an implementation, the method can further include removing the nanowire from the substrate, attaching a first end of the nanowire to a first end of an optical fiber, and inserting a second end of the optical fiber into a channel that extends through the cantilever head from the flat surface to a back surface of the cantilever head, wherein a second end of the nanowire is configured to extend away from the flat surface of the cantilever head. The substrate and the epitaxial layer can form a part of the cantilever head, and the growing of the nanowire can occur directly on the cantilever head. Additionally, the method can include forming the growth mask on the substrate and forming the seed layer within the at least one hole of the patterned growth mask layer.

Optionally, the providing of the seed layer on the substrate can provide a blanket seed layer, the forming of the patterned growth mask layer can form the patterned growth mask layer to have a plurality of holes therein that expose the seed layer, and the exposing of the seed layer to the epitaxial growth environment can grow a plurality of nanowires that extend away from the substrate through the plurality of holes The cantilever can include a cantilever arm that intersects the cantilever head and, subsequent to the forming of the probe, the nanowire can extend from the cantilever head and the nanowire is configured to physically contact a surface of a sample during a measurement of the surface of the sample.

In another implementation, a method for forming a probe for measuring a test sample during atomic force microscopy includes providing a silicon cantilever including a cantilever head, removing a portion of the cantilever head to form a flat surface of the cantilever head, and welding an epitaxial nanowire onto the flat surface of the cantilever head. Optionally, the removing of the portion of the cantilever head to form the flat surface of the cantilever head forms the flat surface at an orientation configured to be parallel to a surface of a sample during a measurement of the surface of the sample using the probe, wherein the epitaxial nanowire is configured to physically contact the surface of the sample during the measurement. Further optionally, the method can include forming a hole in the flat surface of the cantilever head and inserting a first end of the epitaxial nanowire into the hole, wherein a second end of the epitaxial nanowire is configured to physically contact the surface of the sample during the measurement. The epitaxial nanowire may be formed using a process including forming a growth mask having an opening therein and growing the epitaxial nanowire through the opening in the growth mask, wherein a width of the opening defines a diameter of the epitaxial nanowire. Optionally, the epitaxial nanowire may be or include a III-N material, and may be formed with a sharp tip having a radius of 1.0 nanometer or less, wherein the sharp tip is configured to physically contact the sample during the measurement. In one alternative, the nanowire can be grown to include a flat surface, wherein the flat surface is configured to physically contact the sample during the measurement.

In another implementation, a method for forming a probe for measuring a test sample during microscopy includes providing an epitaxial layer on a substrate, forming a patterned etch mask layer over the epitaxial layer, anisotropically etching the epitaxial layer using the patterned etch mask as a pattern to result in a nanowire that extends away from the substrate, and providing the nanowire on a flat surface of a cantilever head of a cantilever, wherein the cantilever and the nanowire are part of the probe for measuring the test sample during microscopy. The method may optionally include removing the nanowire from the substrate and inserting a first end of the nanowire into a cavity within the flat surface of the cantilever head, wherein a second end of the nanowire extends away from the flat surface. Additionally, the method can include removing the nanowire from the substrate, attaching a first end of the nanowire to a first end of an optical fiber, and inserting a second end of the optical fiber into a channel that extends through the cantilever head from the flat surface to a back surface of the cantilever head, wherein a second end of the nanowire is configured to extend away from the flat surface of the cantilever head. The substrate and the epitaxial layer may form a part of the cantilever head, and the anisotropically etching of the nanowire can occur directly on the cantilever head. The cantilever may have a cantilever arm that intersects the cantilever head where, subsequent to the forming of the probe, the nanowire extends from the cantilever head and the nanowire is configured to physically contact a surface of a sample during a measurement of the surface of the sample.

In an implementation, a probe for measuring a test sample during atomic force microscopy (AFM) includes a probe head including a substrate having a surface, wherein the substrate includes a cavity therein extending through the surface and a nanowire including a first end and a second end, wherein the first end of the nanowire extends into the cavity within the substrate of the probe head and the second end of the nanowire is configured to physically contact a surface of a sample during a measurement of the sample. Optionally, the nanowire may be an epitaxial crystal including one or more of gallium nitride, aluminum nitride, indium nitride, an alloy of gallium nitride, an alloy of aluminum nitride, and an alloy of indium nitride. The nanowire can have a length from the first end to the second end of from 100 nanometers (nm) to 10 micrometers (μm), and a width of from 10 nm to 100 nm, and can include one or more of silicon, silicon carbide, and aluminum oxide.

In another implementation, a probe for measuring a test sample during atomic force microscopy (AFM) includes a probe head including a substrate having a surface, wherein the substrate includes a cavity therein extending through the surface, an optical fiber including a first end and a second end, wherein the second end of the optical fiber extends into the cavity within the surface of the probe head, and a nanowire including a first end and a second end, wherein the first end is attached to the first end of the optical fiber and the second end of the nanowire is configured to physically contact a surface of a sample during a measurement of the sample. Optionally, the nanowire can be an epitaxial crystal including one or more of gallium nitride, aluminum nitride, and indium nitride. The nanowire can have a length from the first end to the second end of from 100 nm to 10 μm, and a width of from 10 nm to 100 nm, and the substrate can be or include one or more of silicon, silicon carbide, and aluminum oxide.

BRIEF DESCRIPTION OF THE DRAWINGS

The accompanying drawings, which are incorporated in, and constitute a part of this specification, illustrate implementations of the present teachings and, together with the description, serve to explain the principles of the disclosure. In the figures.

Figure 1:
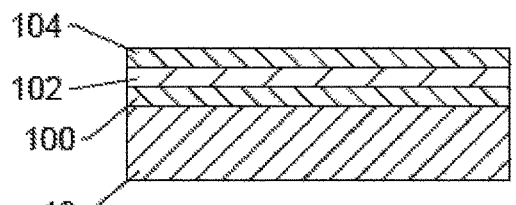
FIGS. 1-10 are cross sections.

It should be noted that some details of the FIGS. have been simplified and are drawn to facilitate understanding of the present teachings rather than to maintain strict structural accuracy, detail, and scale.

DETAILED DESCRIPTION

The following implementations are described for illustrative purposes only with reference to the Figures. Those with skill in the art will appreciate that the following description is exemplary in nature, and that various modifications to the parameters and process implementations set forth herein could be made without departing from the scope of the present teachings. It is intended that the specification and examples be considered as examples only. The various implementations are not necessarily mutually exclusive, as some approaches can be combined with one or more other approaches to form new implementations. Similarly, when a specific fabrication sequence is specified, there are often other related sequences, either well known in the art or variants of the disclosed sequence realized through review of the present disclosure, that can be used to accomplish similar or very similar results. All such sequences are included herein.

Although many variations of scanning probe microscopes have been developed for satisfying the requirements of nanotechnology, microscope techniques which combine integrated laser and topography information of the nano-local area are still developing. No work has been reported toward an attempt to replace silicon (Si) Atomic Force Microscopy (AFM) probes with lasing tips using a wide bandgap semiconductor such as GaN. One or more implementations of the present teachings can provide fabrication of a new generation of AFM tips which may be suitable 1) in high aspect ratio probing microscopy to define vertical walls with almost 90° resolution compared to the scanning angle; 2) as an AFM tip with an aspect to ratio ranging from 10 to 100; 3) for use in quasi-atomic lateral resolution probing microscopy; and 4) as a self-aligned AFM tip optically or electrically pumped for confocal microscopy.

An implementation of the present teachings can include the formation of nanowires (i.e., NWs) that include a Group III nitride, commonly referred to as a "III-N" material, including gallium nitride (GaN), aluminum nitride (AlN), and indium nitride (InN), as high resolution tips for AFM microscopy. GaN exhibits a high bending strength, with a high bulk Young's modulus of 400 GPa compared to CNT which has a Young's modulus on the order of 270-950 GPa. Further, GaN is a material that can be fabricated in high aspect ratio structures with a transverse dimension or effective diameter of from 10 nanometers (nm) to 100 nm and with almost perfect crystal facet sidewalls with lengths ranging from 100 nm to 10 micrometers (μm). These dimensions are well suited to AFM measurements of complex 3D topologies such as the fins used in fin field-effect transistors (i.e., FINFETs) and other structures that present difficult metrology challenges for the integrated circuit industry and other industries.

Various approaches to fabrication of III-N nanowire tips suitable for application in AFM measurements are provided in this disclosure. By way of introduction, the nanowires can be epitaxially grown, for example, using metal-organic chemical vapor deposition (MOCVD) from nanoscale seed areas masked onto a suitable planar substrate. The planar substrate can include silicon (Si), silicon carbide (SiC), aluminum oxide ($Al_2O_3$), etc. In another implementation, the nanowires can be formed by etching a blanket III-N film using, for example, a combination of anisotropic and crystal-facet-selective chemistries. In yet another approach, the III-N nanowires can be fabricated directly onto a cantilever, such as a Si AFM cantilever, using a suitable masking film structure to define the III-N nanowire area of the tip. In some implementations, a plurality of nanowires may be simultaneously formed on a planar substrate, where individual nanowires are subsequently mechanically removed from the substrate and attached to another structure such as an AFM cantilever. Attachment of the nanowire can include a focused ion beam (FIB) attachment process. In other implementations, individual tips can be simultaneously formed on each cantilever of an array or plurality of cantilevers in a single growth process; in these implementations, after the growth of the plurality of nanowires, no further nanowire processing is required as the tips as formed may be used for AFM measurements, although separation or singularization of the array of cantilevers into discrete units may be preferred or necessary.

In addition to desirable mechanical properties of the III-N nanowire materials, their optical properties can be utilized to extend the capabilities of AFM measurements. Over selected alloy ranges, a Group III nitride (including GaN, AlN, InN, an alloy of GaN, an alloy of AlN, and an alloy of InN, gallium aluminum indium nitride) is a direct bandgap semiconductor with a bandgap that can be tuned across the visible and ultraviolet (UV) spectral ranges with compositional (x, y) variations. For example, GaN has a bandgap of about 365 nm. Thus, illuminating the nanowire with a laser source at a energy larger than the material bandgap results in bandgap emission from the nanowire. The nanowire geometry naturally provides a strong field enhancement at the tip of the nanowire, providing a self-aligned, near-field illumination of the probed region of the sample that can be used as an illumination source for optical equipment during AFM measurements. For example, since the nanowire itself is transparent to light at wavelengths below the bandgap, any fluorescence (or Stokes-shifted Raman scattered) light emitted from the illuminated region of the sample can be collected in the nanowire and transported from the sample to collection optics for analysis.

In addition to the mechanical and optical properties of the III-N nanowires, their electrical properties also can be utilized to extend the capabilities of the AFM measurements to other technologies such as scanning tunneling microscopy (STM) measurements and lithography.

Figure 10:
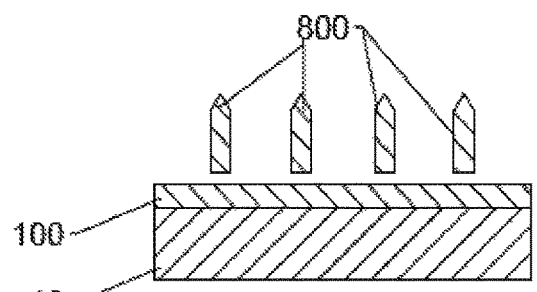
Figure 11:
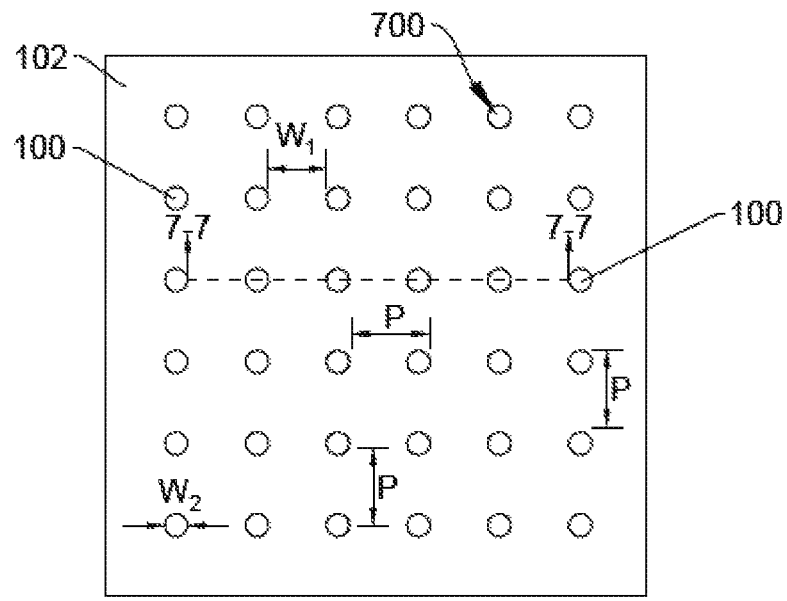
FIG. 11 is a plan view, depicting in-process structures that may be formed during an implementation of the present teachings to form a nanowire or a plurality of nanowires.

In-process structures which can be formed during a process implementation of the present teachings are depicted in the cross sections of FIGS. 1-10 and the plan view of FIG. 11. FIG. 1 depicts a substrate 10, for example a planar substrate that may be or include a silicon wafer having a <111> crystallographic orientation, an aluminum oxide ($Al_2O_3$) substrate, a silicon carbide substrate, or another suitable substrate. FIG. 1 further depicts a seed layer 100 which can be or include a III-N material such as GaN, AlN, InN, or one or more alloys of GaN, AlN, or InN, having a thickness of from about 1 nm to about 100 nm, or another suitable thickness that is formed on, grown on, or transferred to the substrate 10. A growth mask layer 102 is formed on or over the seed layer 100, and an anti-reflective coating (ARC) 104 may be formed on or over the growth mask layer 102 to complete the FIG. 1 structure. The growth mask layer 102 may be or include silicon nitride ($SiN_x$), a silicon oxide such as silicon dioxide ($SiO_2$), or another suitable material that is sufficiently resilient to a high temperature (e.g., up to about 1200° C.) III-N epitaxial growth process during formation of III-N nanowires, can be etched selective to the seed layer 100, and prevents the epitaxial growth using the seed layer 100 as a seed material over the regions that the layer 102 covers. The ARC 104 may be or include, for example, ARC i-CON-7® available from Brewer Science, Inc. The growth mask layer 102 may be formed to a thickness of from about 25 nm to about 200 nm, while the ARC 104 may be formed to a thickness of from about 50 nm to about 150 nm.

Figure 2:
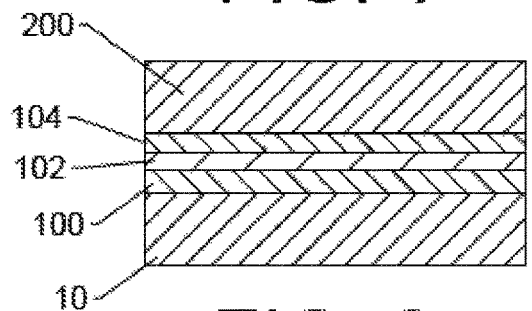
Figure 3:
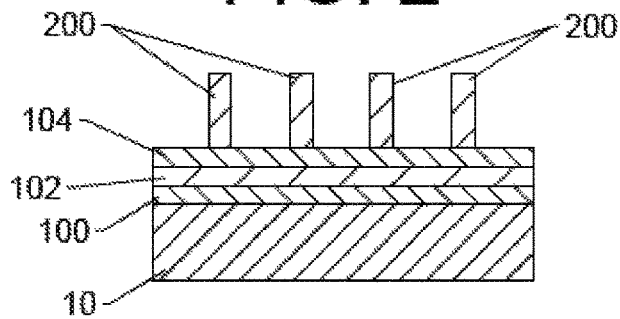
Figure 4:
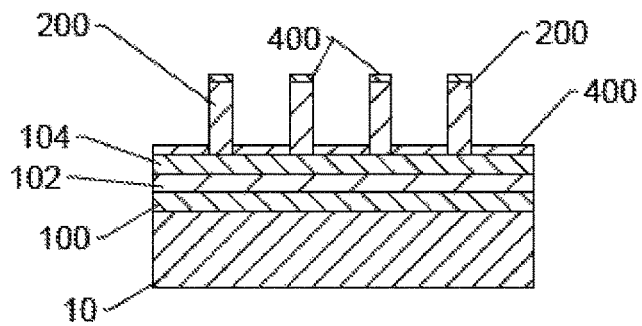

Subsequently, a photoresist layer 200 may be formed on or over the ARC 104 as depicted in FIG. 2, then the photoresist layer 200 may be patterned as depicted in FIG. 3 using, for example, interferometric lithography. Subsequently, a hard mask 400, for example nickel metal or another suitable material, is deposited onto the FIG. 3 structure to result in a structure similar to FIG. 4. The hard mask 400 is directionally deposited to cover exposed horizontally oriented surfaces of the photoresist layer 200 and the ARC 104, while vertical surfaces of the photoresist layer 200 remain substantially free from the hard mask 400 as depicted in FIG. 4. For example, a sputtering process may form the structure of FIG. 4 including portions of the hard mask 400 on or over exposed horizontal portions of the ARC 104 and on exposed horizontal portions of the photoresist layer 200 as depicted. In an alternative, the FIG. 3 structure can be exposed to a chemical vapor deposition (CVD) environment within a chamber (not depicted for simplicity) that forms the hard mask 400 on exposed surfaces of the ARC 104, but does not form the hard mask on the photoresist layer 200.

Figure 5:
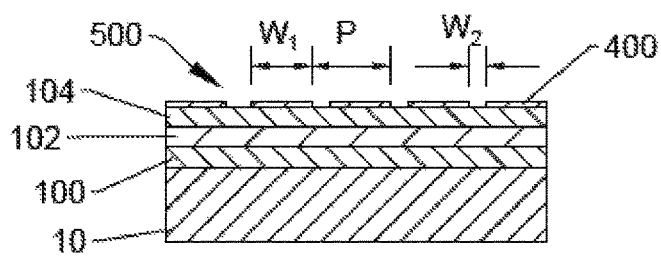

Next, the photoresist layer 200 is removed from the FIG. 4 structure which also removes the hard mask 400 portions that cover the top of the photoresist layer 200 (if present) to result in a structure similar to that depicted in FIG. 5. The hard mask 400 covers portions of the ARC 104 and growth mask layer 102 while leaving other portions exposed. In an implementation, each individual hole in the hard mask 400 of FIG. 5 can have a width "$W_2$" of from about 100 nm 1 µm; further, each individual hole of the hard mask 400 can be separated from at least one adjacent hole by about 300 nm to about 5 µm. The dimension $W_1$ depicted in FIG. 11 depends on the pattern symmetry and the direction of measurement. The holes will have a pitch "P" where, for purposes of this disclosure, "pitch" is defined as the distance between two corresponding points of two adjacent analogous structures or between two corresponding points of two adjacent analogous elements of a single structure. The width $W_2$ of the openings 500 are important to ensure a nanowire has a thickness or width so that it is sufficiently large and robust to prevent breakage during contact with a sample material during use, yet small enough to extend into narrow, high aspect ratio spaces being measured during use. The pitch P between openings 500 is important to ensure that sufficient space is provided to facilitate removal of individual nanowires from the seed layer 100.

Figure 6:
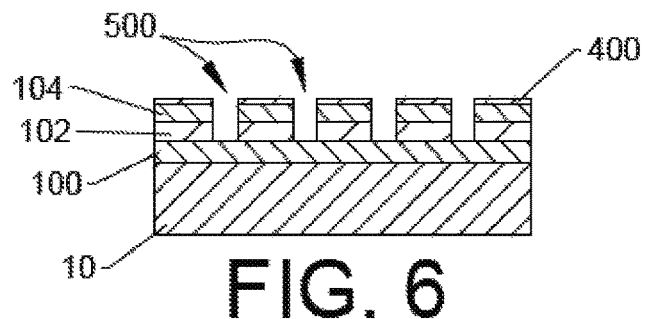
Figure 7:
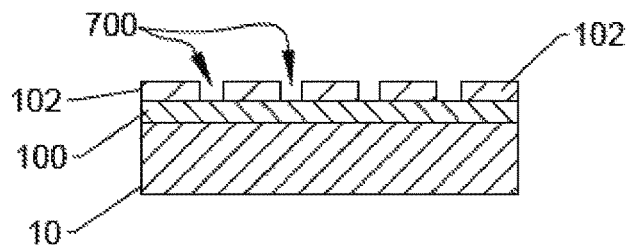

Subsequently, the ARC 104 and the growth mask layer 102 are etched and patterned through the hard mask 400 using the hard mask 400 as a pattern to expose the substrate 400 as depicted in FIG. 6. The ARC 104 and the growth mask layer 102 may be patterned using, for example, the same etch or separate etches to etch each layer. The hard mask 400 and the ARC 104 are then removed as depicted in FIG. 7 to leave the patterned growth mask layer 102, which will provide a growth mask for the nanowires by way of at least one hole 700, or a plurality of holes 700 as depicted, in the growth mask layer 102 that expose the seed layer 100 through the growth mask layer 102. It will be understood that an array or plurality of nanowires can be simultaneously formed, with the number formed depending on the dimensions of the growth mask layer 102 and underlying layer, and the dimensions of the holes 700 within the growth mask layer 102. The structure of FIG. 7 is taken along 7-7 of the plan view of FIG. 11. Because the features of the hard mask 400 are transferred to the growth mask 102, the dimensions $W_1$, $W_2$, and P in the hard mask 400 are preferably transferred to the growth mask 102 as depicted in FIG. 11. With regard to FIG. 11, the two dimensional (2D) symmetry of the pattern of holes 700 is an important design element. The pattern of holes may include square or triangular 2D lattices, or another suitable 2D lattice. The 2D symmetry of the pattern of holes 700 is an important design element to allow separation of individual nanowires or of nanowires attached to portions of the substrate for subsequent fabrication for use as (or with) AFM tips.

Figure 8:
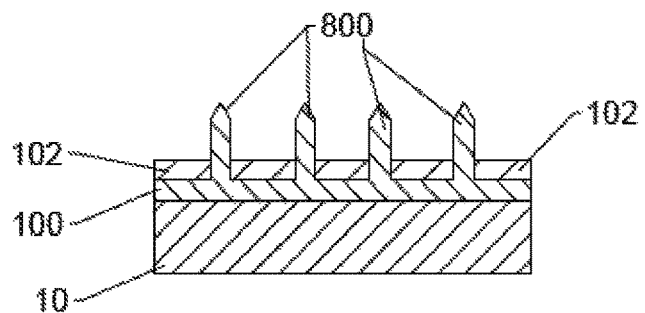
Figure 9:
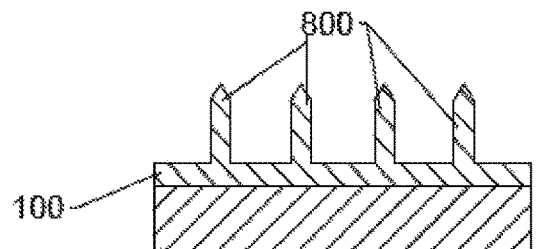

Next, the FIG. 7 structure is exposed to an epitaxial growth environment, for example, within a CVD chamber, that facilitates epitaxial growth of the portions of the III-N seed layer 100 that are exposed through the holes 700 in the growth mask layer 102. Exposure of the FIG. 7 structure to the environment results in nanowires 800 extending away from the substrate 10 and through the holes 700 of FIG. 7 as depicted in FIG. 8.

The epitaxial growth environment can include a metal-organic chemical vapor deposition (MOCVD) process. For example, tri methyl gallium, tri methyl aluminum and tri methyl indium may be used as sources for group III elements, while ammonia may be used as a group V (nitrogen) source. Nanowires may be obtained by varying growth temperature from about 850° C. to about 950° C. Nanowire height may be varied from about 100 nm to about 5 µm, while the nanowire diameter may be varied from about 40 nm to about 1 µm. In FIG. 8, a terminal growth end of each nanowire is depicted as having a sharp tip. The shape of the nanowire tip can be controlled by adjusting the MOCVD growth conditions to form a nanowire end having a desired shape, for example, flat or pointed. For example, by controlling the V/III ratio to a value of from 40 to about 100, the tip at the terminal growth end will grow to have nearly a flat surface. In another variation, the III/V ratio can be controlled to a value of from about 600 to about 10,000, such that the tip at the terminal growth end is a sharp tip having a highly angular aspect with a tip radius of 1.0 nm or less, for example about 0.5 nm, close to a single atom. In an implementation, the nanowires can be formed to have a width or diameter of from about 500 nm to about 1,000 nm, or from about 400 nm to about 600 nm, for example about 500 nm. Using nanoscale growth to form the nanowires 800, the full armamentarium of III-N growth variations can be formed and used. In particular, multiple dopings with materials such as p-type or n-type material can be introduced to control the electrical conductivity of the nanowire. P-N junctions can be grown as part of diode and transistor structures. Material changes such as heterojunctions or quantum wells can be grown along with length of the nanowire to provide unique optical or charge trapping effects. Further, material variations such as lower bandgap quantum wells can be grown in a core-shell geometry that is advantageous for lasing across the visible range of the light spectrum.

Subsequently, the growth mask layer 102 may be removed and the nanowires 800 may be separated from the seed layer 100 as depicted in FIG. 10. In another implementation, the nanowires 800 may be separated from the seed layer 100 with the growth mask 102 in place (not depicted for simplicity). The nanowires 800 may be separated from the seed layer 100 using, for example, a commercially available focused ion beam/scanning electron microscope (FIB/SEM) tool, for example, a model Gemini 2 crossbeam 550 available from ZEISS. Each nanowire 800 may be segmented and removed from the seed layer 100 and transferred to a receiving surface, such as a prepared cantilever surface, using a nanomanipulator such as an OmniProbe® needle available from Oxford Instruments mounted to FIB/SEM tool as described in more detail below.

Figure 12:
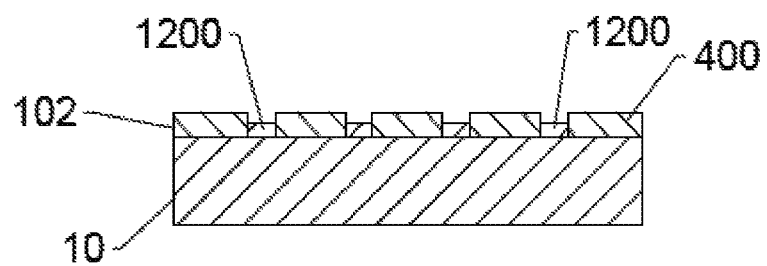
FIG. 12 is a cross section of an in-process structure for forming a nanowire or plurality of nanowires according to an implementation of the present teachings.

Variations to the processes described herein will become evident from the description herein. For example, in one variation, the growth mask 102 can be formed directly on or over the substrate 10 with no intervening seed layer 100. The process continues according to FIGS. 1-7 with any process alternations necessary for the exposed structures and/or materials. Next, an epitaxial growth catalyst layer 1200 which functions as a seed layer can be deposited or otherwise formed on the substrate 10 within the holes 700 (FIG. 7) within the growth mask 102 to result in a structure similar to that depicted in FIG. 12, where the epitaxial growth catalyst layer 1200 (i.e., the seed layer) is exposed through the growth mask 102. The epitaxial growth catalyst layer 1200 may be or include one or more of nickel, gallium, gold, or platinum, and may be formed, for example, by molecular beam epitaxy (MBE) or MOCVD. Subsequently, the process continues according to FIGS. 8-10, with any process alterations necessary for the exposed structures and/or materials. In this implementation, the nanowires 800 will be an epitaxial crystal variant based on the chemistry of the substrate 10. In other variations, the growth mask may be formed using any number of technologies, including interferometric lithography, optical lithography, nanoimprint lithography and electron-beam lithography. In general, lithography methods of formation may involve coating the substrate with a polymer film stack of one or more layers, exposing the film stack to actinic radiation to define specific areas on the film stack and then selectively removing either the exposed or the unexposed areas of the film stack (depending on the use of positive or negative photoresist) and transferring the pattern from the remaining polymer film into the growth mask.

Figure 13:
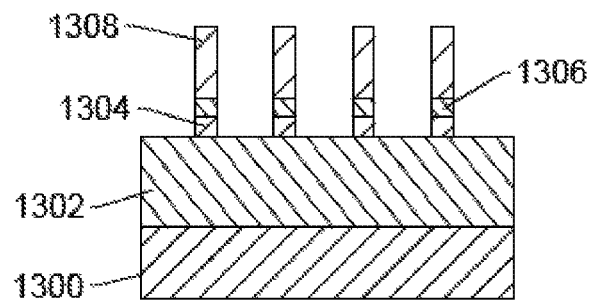
FIGS. 13-16 are cross sections depicting in-process structures that may be formed during another implementation of the present teachings to form a nanowire or a plurality of nanowires.
Figure 14:
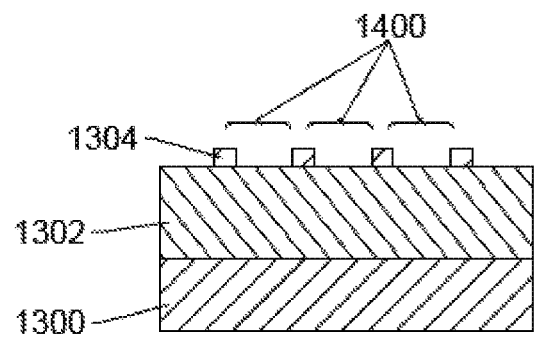
Figure 15:
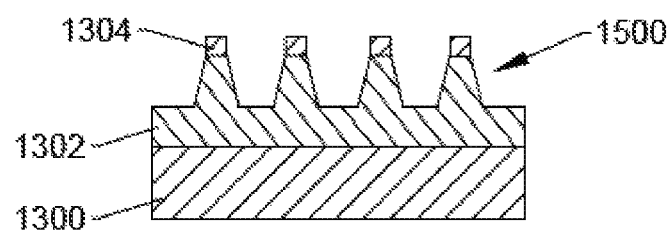
Figure 16:
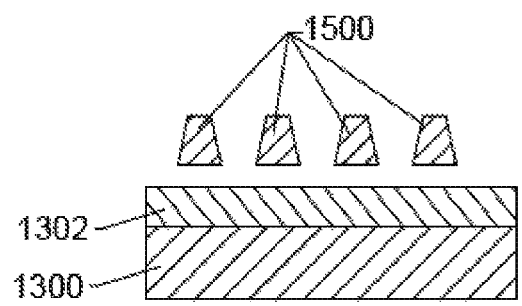

In the process of FIGS. 1-11, the growth mask 102 is subjected to an epitaxial growth at a high temperature and thus must be provided by a material that is sufficiently resilient to these high temperatures. In an alternate implementation described below and in reference to FIGS. 13-16, the GaAlInN film is grown as a large-area blanket film and patterning is provided subsequent to the high-temperature growth. To form the structure of FIG. 13, a III-N epitaxial layer 1302 is formed, grown, or transferred onto a substrate 1300 such as a silicon wafer. In an implementation, the epitaxial layer 1302 can have a thickness of from about 500 nm to about 5 µm, or from about 500 nm to about 3 µm. A blanket mask layer, for example $Si_3N_4$, is formed on or over the III-N epitaxial layer 1302, a blanket ARC is formed on or over the blanket mask layer, and a patterned photoresist layer 1308 is formed on or over the blanket ARC. Subsequently, the blanket ARC and the blanket mask layer are etched using the patterned photoresist layer 1308 as a pattern to form a patterned ARC 1306 and a patterned mask layer 1304, thereby resulting in a structure similar to that depicted in FIG. 13. Subsequently, the patterned photoresist layer 1308 and the patterned ARC 1306 are removed to result in the FIG. 14 structure. As depicted in FIG. 14, the patterned mask layer 1304 includes posts resulting in holes or unprotected areas 1400 through which the III-N epitaxial layer 1302 is exposed. Next, the III-N epitaxial layer 1302 may be etched using the mask layer 1304 as a pattern to result in a structure similar to that depicted in FIG. 15. The etch of the III-N epitaxial layer 1302 may be performed using an anisotropic dry etch. The anisotropic dry etch of the III-N epitaxial layer may include an inductively coupled plasma (ICP) and a chlorine-($Cl_2$) based etch chemistry. The radiofrequency (RF) power may be varied, for example, from about 20 watts (W) to about 70 W, while the ICP power may be varied from about 100 W to about 600 W. The etch pressure may be varied from about 2.5 millitorr (mTorr) and about 15 mTorr to obtain sidewalls with angles from about 45° and about 85°. The substrate temperature can vary from about −60° C. to +250° C., according to the quality of the sidewall and etching rate required. The sidewall angle of the completed nanowire an be controlled and optimized as desired during etching by selecting the etch parameters to set a desired anisotropy/isotropy ratio, where the sidewall verticality is proportional to the ratio. Nanowire sidewall angles of from about 45° to about 85°, or from about 70° to about 80°, with respect to a plane of the surface of the substrate 1300 from which the nanowires 1500 (FIG. 15) are available. After anisotropically etching the III-N epitaxial layer 1302 to form the nanowires 1500 as depicted in FIG. 15, the mask layer 1304 can be removed and the nanowires 1500 can be separated from any unetched portion of the III-N epitaxial layer 1302, for example using the FIB/SEM tool and OmniProbe as described above, to result in the structure of FIG. 16. Subsequent to removing the nanowires 1500, the remaining portion of the III-N epitaxial layer 1302 of FIG. 16 may have a thickness of from about 500 nm to about 3 μm.

The implementation of FIGS. 13-16 may be performed using an anisotropic dry etch. In another implementation, crystallographic (e.g., crystal-facet) etching may be performed on the structure of FIG. 15 subsequent to the anisotropic etching. For example, the etching may include exposure to an inductively coupled plasma (ICP) followed by exposure to a selective liquid or "wet" etchant such as potassium hydroxide (KOH), thereby performing an anisotropic wet etch. For some materials, KOH has an etch rate selectivity of about 400:1 in <100> crystal directions than in <111> directions. This etch utilizes the crystal orientation of the III-N epitaxial layer 1302 to result in a vertical or near-vertical etch of the III-N epitaxial layer 1302 with little or no undercutting of the mask 1304. Nanowires having vertical or near-vertical sidewalls (i.e., from about 85° to about 90°, with respect to a plane of the surface of the substrate 1300 from which the nanowire extends) are particularly useful in three-dimensional (3D) metrology applications when measuring topographies that include, for example, narrow, high-aspect openings and other features. In this implementation, the upper surface of the FIG. 14 structure is exposed to a liquid solution including KOH, for example a solution including 25% to 35% by volume KOH, for example 30% by volume KOH, and 65% to 75% by volume, for example 70% by volume, of one or more other solutions such as hydrochloric acid and/or a photoresist developer such as an AZ® 400K series developer available from Integrated Micro Materials of Argyle, Tex., is disposed on the upper surface of the FIG. 14 structure, thereby resulting in the pillar-shaped nanowires 1700 of FIG. 17. After etching, the mask 1304 can be removed and each nanowire 1700 may be segmented and removed from the III-N epitaxial layer 1302 and transferred to a receiving surface, such as a prepared cantilever surface, using the FIB/SEM tool as described in more detail below.

Figure 19:
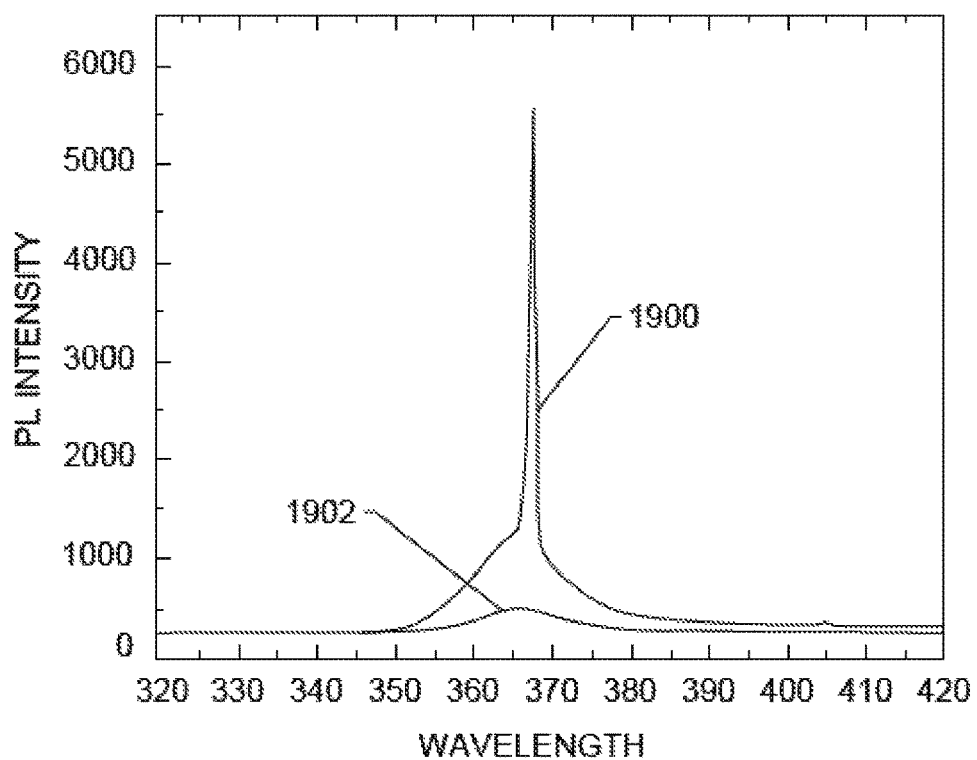
FIG. 19 is a plot showing a laser emission spectrum of sample nanowires formed using an implementation of the present teachings.

Defects in the sidewalls of the nanowires were investigated by using Transmission Electron Microscopy (TEM) and by optically pumping of nanowires. FIG. 19 is a plot showing a laser emission spectrum of sample nanowires formed using an implementation of the present teachings and having a diameter of about 120 nm and a length of about 1.6 μm, plotting photoluminescence (PL) Intensity (arbitrary units) at various light wavelengths (in nanometers). As discussed above, GaN is a direct bandgap semiconductor that lases when optically pumped using a 266 nm source, or a source of above bandgap optical excitation. Optical pumping of the sample nanowires with a 266 nm source using, for example, a 4th harmonic of a yttrium aluminum garnet (YAG laser) results in lasing at the bandgap of the nanowire. As shown at line 1900 in FIG. 19, nanowires lase at about 367.5 nm when pumped using a 266 nm source with a spectral line width of about 1 nm. Line 1902 shows that no lasing occurs when the source is below the threshold pump level of 266 nm. This evinces that nanowires formed in accordance with the present teachings have very smooth and defect-free side walls, leading to low cavity losses. In an implementation, the process and various variations thereof can be used to form a nanowire having a root mean square (RMS) sidewall roughness of about 3 nm or less.

Figure 20:
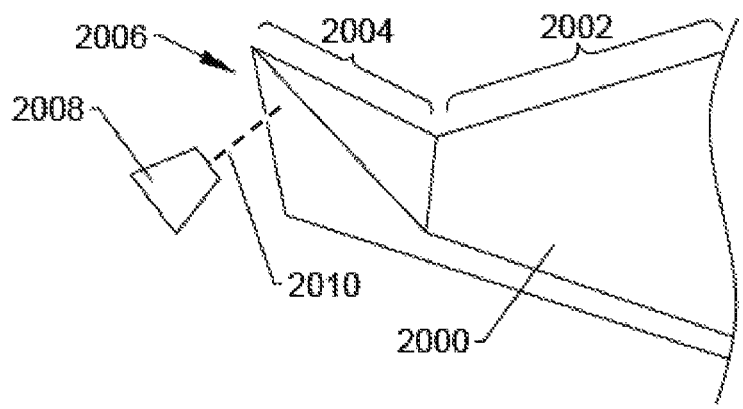
FIGS. 20-23 are perspective depictions of in-process probe head structures that may formed in an implementation of the present teachings to include the use of a disclosed nanowire.
Figure 21:
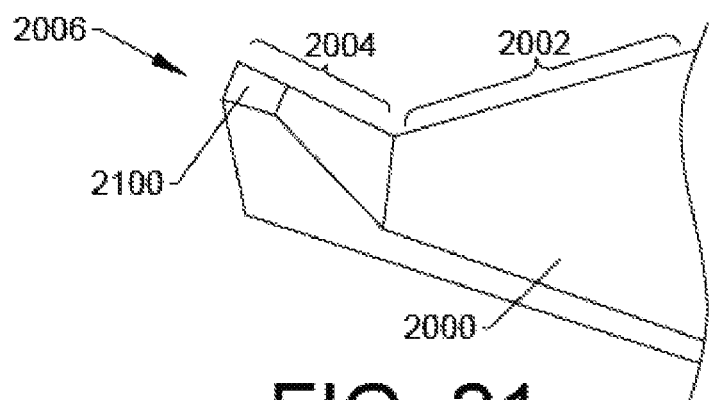
Figure 22:
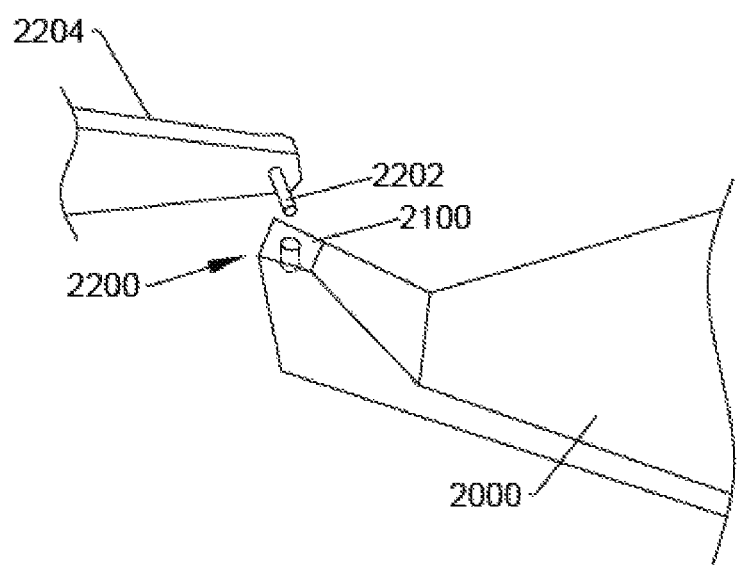
Figure 23:
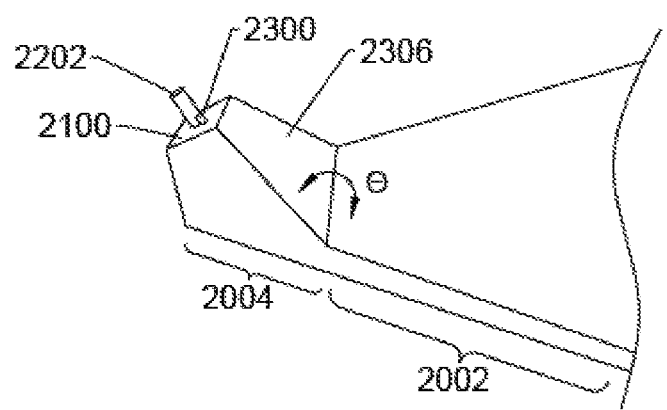

After forming one or more nanowires as discussed above, the nanowire can be transferred to another structure for use, such as the a probe head that may be part of a cantilever or cantilever assembly as represented by the perspective depictions of FIGS. 20-24. The cantilever may be a single cantilever, or the cantilever may be part of an in-process array of cantilevers during formation of from, for example, a silicon substrate. FIG. 20 depicts a cantilever 2000 including an arm 2002 (i.e., cantilever arm) that intersects a head 2004 (i.e., cantilever head), where the probe head or head 2004 includes a tip region or tip 2006. Using a commercial FIB tool 2008 outputting a focused ion beam 2010 as described elsewhere herein, the tip 2006 of the cantilever 2000 can be segmented or removed from the cantilever 2000 to form a plateau or flat surface 2100 as depicted in FIG. 21 that can be processed to host a nanowire and to provide a STM tip. The orientation and angle of the flat surface 2100 of the head 2004 relative to the arm 2002 of the cantilever 2000 can be designed and formed such that after the nanowire (e.g., 2202, 2502, 2602) is positioned relative to the flat surface 2100, and the cantilever 2000 is mounted in the AFM instrument, a longitudinal axis through a center of the nanowire is vertical or perpendicular to the flat surface 2100 and to the sample surface to be probed with the AFM (see FIG. 27 and the related text below for further description). Optionally, a hole can be drilled in the surface 2100 using the FIB tool 2008 to provide a cavity 2200 through the surface 2100 and into the head 2004 of the cantilever 2000 to receive the nanowire, where the dimensions of the cavity are suitable for mounting of a nanowire. Subsequently, a nanowire 2202 can be transported to the surface 2100 and, optionally, to the cavity 2200, using a nanomanipulator 2204 such as an OmniProbe. A first end of the nanowire 2202 can be attached to the cantilever 2000, specifically to the surface 2100 of the cantilever 2000, and optionally inserted into the cavity 2200, thereby securing the nanowire 2202 to the cantilever 2000 as depicted in FIG. 23, where a second end of the nanowire that is opposite to the first end extends away from the surface 2100 of the probe head 2004.

The nanowire 2202 can be attached to the nanomanipulator 2204 using, for example, platinum deposition onto the nanomanipulator 2204. The nanowire 2202 can be detached from the substrate 10 or from the remainder of the III-N epitaxial layer 1302 by applying a mechanical force to the nanomanipulator 2204.

As depicted in FIG. 23, the nanowire 2202 extends perpendicularly away from a plane of the surface 2100. In general, the nanowire 2202 will extend from the plane of the surface 2100 at an angle that will be perpendicular or vertical to a major surface of a sample under test during use of the cantilever 2000. This angle can be or can approximate an interior angle theta (Θ) depicted in FIG. 23 of the cantilever 2000 which is vertical to the sample in the AFM measurement. The longitudinal axis of the nanowire 2202 can be approximately parallel to planar face 2306 of the head 2004, where the planar face 2306 intersects the arm 2002 of the cantilever 2000 at an angle the angle Θ. The angle Θ may be from about 45° to about 60°. The flat surface 2100 may intersect the planar face 2306 from about 90° to about 180°. The nanowire 2202 may be secured to the surface 2100 of the head 2004 using one or more micromanipulation techniques, for example, platinum deposition and e-beam welding using, for example, a SEM beam. After welding a first side of the nanowire 2202, the nanomanipulator 2204 can be detached from the nanowire 2202 using mechanical force. Subsequently, the cantilever 2000 can be rotated and a second side that may be opposite to the first side can be similarly welded. Welding at any number of points can continue until the nanowire 2202 is secured to the head 2004 of the cantilever 2000. While FIG. 23 depicts one weld 2300, two or more welds 2300 may be performed, including completely encircling the nanowire 2202 with welds 2300 (not depicted for simplicity).

It will be appreciated that the first end of the nanowire 2202 can be directly attached to the flat surface 2100 of the head 2004 without forming the cavity 2200, for example, using two or more welds 2300. This implementation would also appear similar to FIG. 23.

Figure 24:
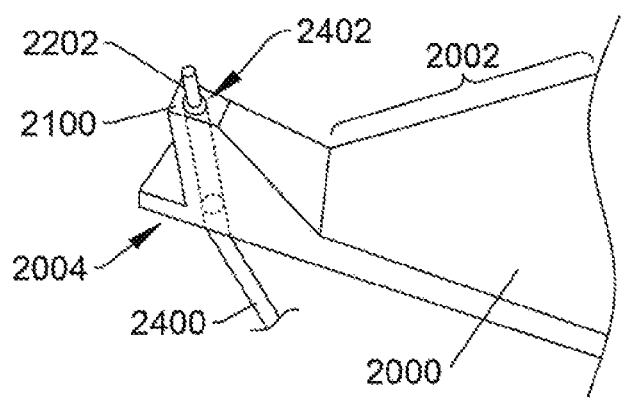
FIG. 24 is a perspective depiction of a probe head structure that may formed in an implementation of the present teachings to include the use of a disclosed nanowire attached to an optical fiber.

In an implementation, the tip of the III-N nanowire may be used for near field optical measurements in addition to, or in place of, force measurements. Near-field optical microscopy is a powerful addition to nanoscale measurements offering additional information on samples. In conventional AFM systems, direct illumination of the test sample and collection of light reflected or fluorescently emitted from the test sample is difficult. In conventional systems, a probe that may include a cantilever and tip is positioned close to the region of the test sample being measured. The optical system that collects light reflected from the test sample must be offset from the probe head which results in shadowing of the reflected/fluoresced light. In an alternative implementation, as depicted in FIG. 24, the first end of the III-N nanowire 2202 can be mounted or attached to a first end of an optical fiber 2400 such as a fiber optic cable that is light transmissive, where the optical fiber 2400 extends through a cavity or channel 2402 completely through the head 2004. The optical fiber 2400 may be secured to the head 2004 of the cantilever 2000 using, for example, friction, an adhesive, or a suitable mechanical fastener (not depicted for simplicity). A second end of the optical fiber 2400 can be optically linked to appropriate illumination source and detection optics as known in the art. The optical fiber 2400 may be or include a single mode core-cladding fiber that is tapered by one or more known extrusion processes to match the optical mode of the fiber to the optical mode of the III-N nanowire. Alternatively, a multi-mode fiber may be used, in particular for applications where fluorescence is collected from the sample. The optical fiber 2400 may be or include a silica core with doped silica cladding fiber available, for example, from Thorlabs of Newton, N.J. A channel 2402 through the head 2004 can be formed using, for example, an anisotropic etch, mechanical drilling, or another suitable material removal technique. The nanowires can be attached to the flat surface and/or to the optical fiber 2400 after the optical fiber 2400 is positioned within the channel 2404, thereby mounting the optical fiber 2400 and the nanowire 2202 to the cantilever 2000 as depicted in FIG. 24. This implementation can be utilized to perform optical pumping of the nanowire 2202 through the optical fiber 2400 using a wavelength at which the optical fiber 2400 is transmissive, thereby illuminating the test sample with light during testing or measurement. Further, light emitted by the nanowire 2202 and reflected from the test sample can be collected through the optical fiber 2400 and used for data relative to the test sample. Additionally, fluorescence from the test sample can be collected by the optical fiber 2400, through and/or around the nanowire 2202. Since the nanowire 2202 is used for both the AFM topology measurement and the fluorescence collection, the system that uses the cantilever 2000 assembly is self-aligned in that the fluorescence is collected precisely from the region that is being probed by the AFM. This serves to circumvent the alignment problem with conventional systems, where the light illumination of the test sample and the collection of the light reflected from the test sample are separated into two different subcomponents.

In an implementation, the optical fiber 2400 can be formed by extrusion to match an optical mode of the optical fiber 2400 with the optical mode of the nanowire 2202. Optical fiber mode diameters are established by the core and cladding dimensions and refractive indices; the modal index of the nanowire is established by the dimensions and refractive index of the nanowire. As known in the art, the optical fiber can be extruded to adiabatically adjust the effective modal index to match that of the nanowire. In an implementation, the dimensions of the nanowire and the fiber can be matched such that they can both be mounted in the same hole in the cantilever. Because the refractive indices of the fiber and the nanowire are very different, an appropriate optical coating can be applied to the end of the fiber adjacent to the nanowire to reduce the reflectivity of the source and detected radiation at this interface.

Figure 25:
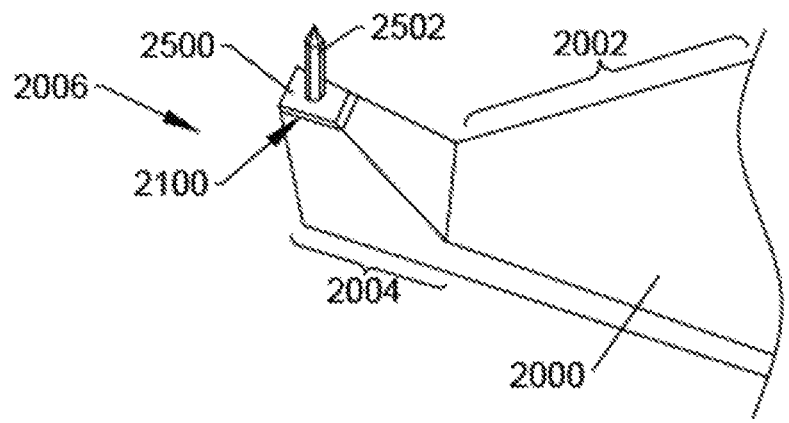
FIG. 25 is a perspective depiction of a probe head structure that may formed in an implementation of the present teachings to include the use of a disclosed nanowire.

Variations to the process and structure implementations will become apparent to an artisan of ordinary skill in the art from the disclosure herein. For example, the process implementation depicted with reference to FIGS. 1-9 may be performed directly to the surface 2100 of the cantilever 2000 of, for example, FIG. 21. In this implementation, the seed layer 100 and the substrate 10 are part of the probe head 2004 and the growing of the nanowire occurs directly on the probe head. This implementation can result in a structure similar to that depicted in FIG. 25, which includes the head 2004 of the cantilever 2000, a III-N epitaxial layer 2500, and a nanowire 2502, where the nanowire 2502 extends from the surface of the III-N epitaxial layer 2500 and the head 2004. Variations to the process depicted in FIGS. 1-9 and described in the related text may be made by one of ordinary skill in the art to result in the structure of FIG. 25. By way of example, the surface 2100 may be machined to expose a silicon <111> crystal lattice surface designed to be parallel to the sample surface in the AFM tool. The <111> may be used to grow c-axis GaN nanowires. The machined surface may be covered with a growth mask such as silicon nitride (Si$_3$N$_4$) and/or silicon dioxide (SiO$_2$), analogous to growth mask 102 of FIG. 7, and having one hole analogous to one of holes 700 formed therein. Subsequently, a thin III-N buffer layer may be formed, the nanowire 2502 may be grown, and the growth mask may be removed. Growth of the nanowire 2502 can include layered growth and core-shell growth, depending on the particular nanowire 2502 structure, shape, and size that is desired. A crystal-face selective etch process can be performed after an initial growth of the nanowire 2502 to smooth the nanowire and to reduce a diameter of the nanowire. This process implementation can be performed on a single in-process cantilever 2000, or the implementation may be simultaneously formed on an array or plurality of in-process cantilevers to simultaneously form a plurality of such nanowires 2502 on a plurality of cantilevers 2000. In contrast to the process implementation of FIGS. 22 and 23, which forms a cavity 2200 and inserts the pre-formed nanowire 2202 into the cavity 2200, the implementation of FIG. 25 self-aligns the nanowire 2502 to the cantilever 2000 at precise positioning possible using lithographic processing techniques. Further, mechanical stresses to the nanowire 800 (FIG. 10) during, for example, separation from the seed layer 100, as well as transportation from the seed layer 100 to the cantilever 2000, are is avoided.

Figure 27:
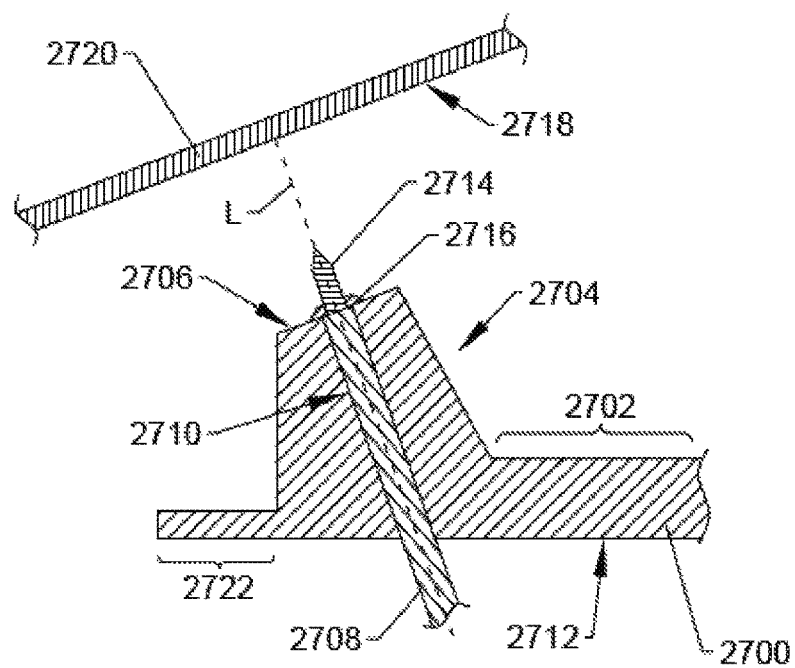
FIG. 27 is a cross section depicting a nanowire used as part of a probe head for measurement of topography of a surface of a test sample in an implementation of the present teachings.

FIG. 27 is a cross section depicting detail of a cantilever 2700 having an arm 2702 and a head or tip 2704. The tip 2704 includes a flat surface 2706. A optical fiber 2708 passes through a channel 2710, where the channel 2710 extends through the tip 2704 of the cantilever 2700 from the flat surface 2706 to a back surface 2712 of the tip 2704 of the cantilever 2700. As depicted, the optical fiber 2708 protrudes from the back surface 2712, and is connected to supporting equipment (not individually depicted for simplicity). A nanowire 2714 as described herein is coupled to the optical fiber 2708 using, for example, a fastener 2716 such as an adhesive, a weld, a mechanical fastener, etc. In an implementation, longitudinal axes "L" of the nanowire 2714 and a portion of the optical fiber 2708 within the channel 2710 can align with each other, although other configurations such as an offset alignment are contemplated. Further, the nanowire 2714 can be attached to the optical fiber 2708 and the tip 2704 such that the longitudinal axis "L" of the nanowire 2714 is perpendicular to the flat surface 2706. Additionally, the cantilever 2700 can be designed such that the flat surface 2706 is parallel or substantially parallel with a surface 2718 of a sample 2720 during measurement or testing of the sample 2720 using the cantilever 2700, which can form part of a microscope probe. Thus the axis "L" of the nanowire 2714 is also thereby designed to be parallel or substantially parallel with the surface 2718 of the sample 2720. This configuration can reduce or prevent physical contact between the flat surface 2706 of the tip 2704 and the sample 2720 during measurement or testing, and allow a terminal end of the nanowire 2714 to extend into high aspect topography of the sample 2720.

In microscopy using a conventional cantilever, alignment of the cantilever to the sample being measured is typically performed using a method that reflects a laser beam from a laser off of a back surface of the cantilever head. In the present implementations that use the optical fiber, for example optical fibers 2400 (FIG. 24) and 2708 (FIG. 27), the optical fibers have the potential to undesirably block the laser beam during alignment of the cantilever 2000, 2700 with the sample 2720. In these implementations, with reference to FIG. 27, the head 2704 of the cantilever 2700 can be formed to include an extension 2722 that provides a reflective surface that may be continuous with surface 2712 and used to reflect a laser beam during alignment of the cantilever 2700 to the test sample 2720. The extension 2722 can be formed, for example, during formation of the cantilever 2700 from the same material such as silicon. The extension 2722, the head 2704, and the arm 2702 of the cantilever 2700 may therefore be formed from a single piece of material. In another implementation, the extension 2722 can be formed as a different substructure that is attached to the head 2704 of the cantilever 2700 prior to use.

Figure 17:
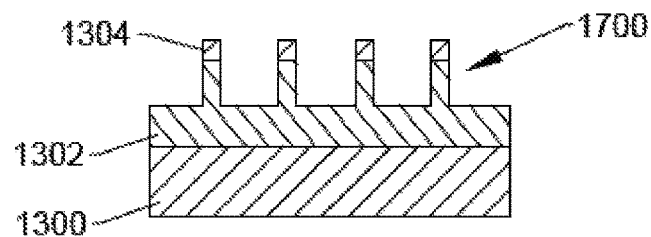
FIGS. 17 and 18 are cross sections depicting in-process structures that may be formed during another implementation of the present teachings to form a nanowire or a plurality of nanowires.
Figure 18:
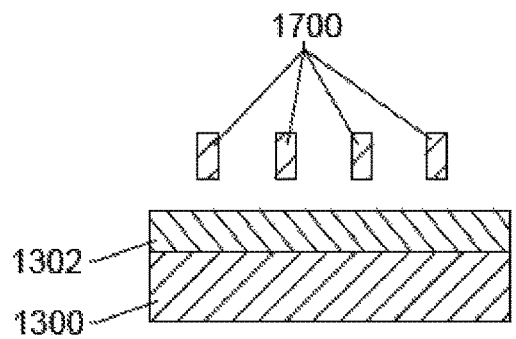

Additionally, each of the process implementations depicted with reference to FIGS. 13-16, and 17 and 18, may be performed directly to the surface 2100 of the cantilever 2000 of, for example, FIG. 21. In an implementation, this may be directly to the arm 2002 of the cantilever 2000 if, for example, Θ=180°. These implementations can result in a structure similar to that depicted in FIG. 26, which includes the head 2004 of the cantilever 2000, a III-N epitaxial layer 2600, and a nanowire 2602, where the nanowire 2602 extends from the surface of the III-N epitaxial layer 2600 and the head 2004. The nanowire 2602 can have sidewalls that intersect the III-N epitaxial layer 2600 at an angle of from about 45° to about 85°, similar to that as depicted for nanowires 1500 in the FIG. 15 structure, or at an angle of from about 85° to about 90°, similar to that as depicted for nanowires 1700 in FIG. 17, depending on whether the etch of the III-N epitaxial layer 2600 includes an isotropic component (FIG. 15) or is highly anisotropic (FIG. 17).

Figure 26:
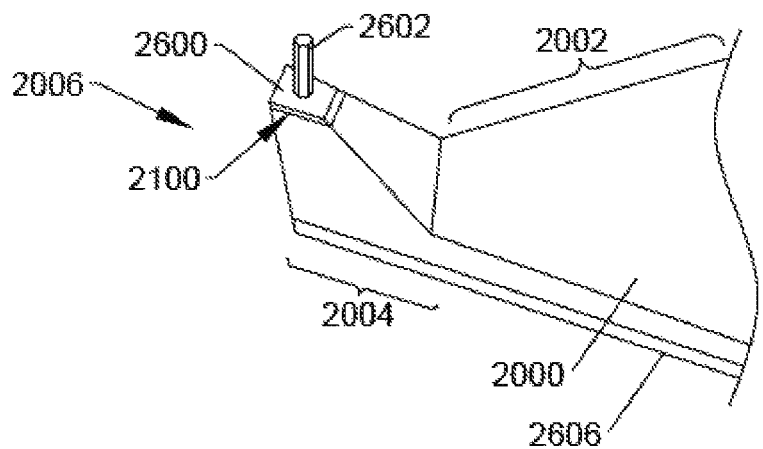
FIG. 26 is a perspective depiction of another probe head structure that may formed in an implementation of the present teachings to include the use of a disclosed nanowire.

Variations to the process depicted in FIGS. 13-16, and 17 and 18, and described in the related disclosure may be made by one of ordinary skill in the art to result in the structure of FIG. 26. The process flow may be again designed using <111> silicon since this material has a close lattice constant to GaN, and can host GaN after growing a thin buffer layer of a material such a AlN. In an implementation, after forming a structure similar to that depicted in FIG. 21, the cantilever 2000, which may be a single cantilever or an array of cantilevers as part of a semiconductor wafer, can be transferred to a MOCVD chamber to grow a thin buffer layer of a material such as AlN, and then a C-plane GaN layer analogous to layer III-N epitaxial layer 1302. Subsequently, a back side of the semiconductor wafer can be coated with reflective layer 2604, for example a metal such as aluminum or silver, to increase reflectivity of the cantilever(s) 2000 during AFM measurement. Subsequently, a patterned mask layer analogous to patterned mask layer 1304 may be formed on the III-N epitaxial layer. Next, the III-N epitaxial layer can be etched according to one of FIG. 15 or 17 to result in the nanowire 2602.

Creating an opening on the top of the AFM cantilever allows a laser beam from a laser source to activate the GaN such that the GaN lases and directly illuminates the test sample with the light emitted from the GaN during the lasing. In an implementation, a Bragg diffraction pattern may be formed on the GaN tip to allow activation of the GaN using the laser beam from the laser source. Bragg diffraction patterns can be created on the vertical wall of the nanowire 2202 (FIG. 23) or 2606 (FIG. 26) using, for example, a FIB milling method.

Figure 28:
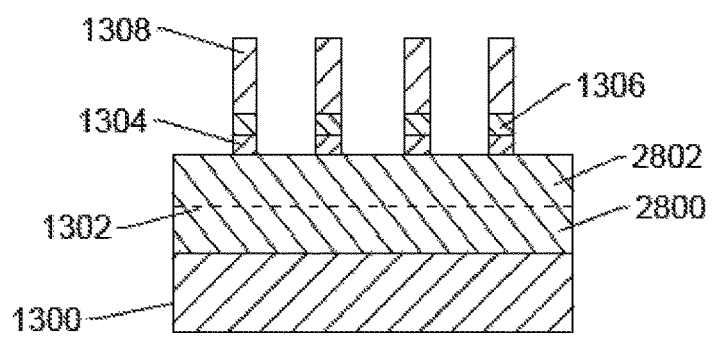
FIG. 28 is a cross section of an in-process structure that can be formed with a p-n junction as a variation to the process of FIGS. 13-18.
Figure 29:
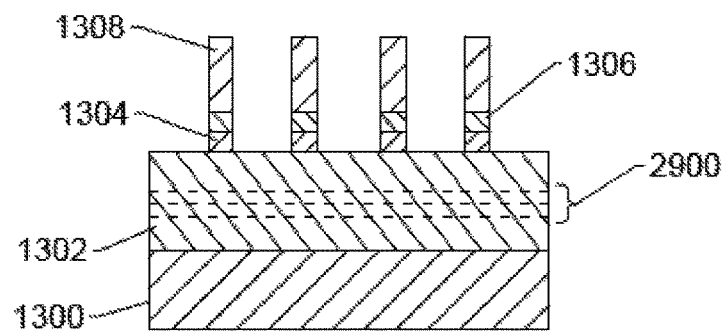
FIG. 29 is a cross section of an in-process structure that can be formed with one or more quantum wells as a variation to the process of FIGS. 13-18.

With the etching approach of nanowire formation as depicted in FIGS. 13-18, the III-N epitaxial layer 1302 can be structured in the vertical direction, for example with p-n junctions and with lower bandgap quantum wells that can be selectively optically excited. These dopant and composition variations can be included in the growth of the epitaxial layer as known in the art. FIG. 28 depicts a structure similar to FIG. 13, and including a p-n junction formed as part of the epitaxial layer 1302, with an n-layer 2800 and a p-layer 2802. Typical n-type dopants for GaN are known, and include silicon. Typical p-type dopants for GaN include magnesium. It will be understood that the order of the n-layer 2800 and the p-layer 2802 can be reversed, depending on the growth process. FIG. 29 depicts a series of quantum wells 2900 grown in the epitaxial layer 1302. These quantum wells are composed of a lower bandgap material, for example, $Ga_xIn1-xN$ in a GaN epitaxial layer as is known in the art. After forming the structure of FIG. 28 or FIG. 29, the process can continue, for example, as described with reference to FIGS. 14-18.

The core-shell geometry discussed above in the nanoscale epitaxial growth approach can be achieved by a regrowth of the III-N material after the etching steps.

Figure 30:
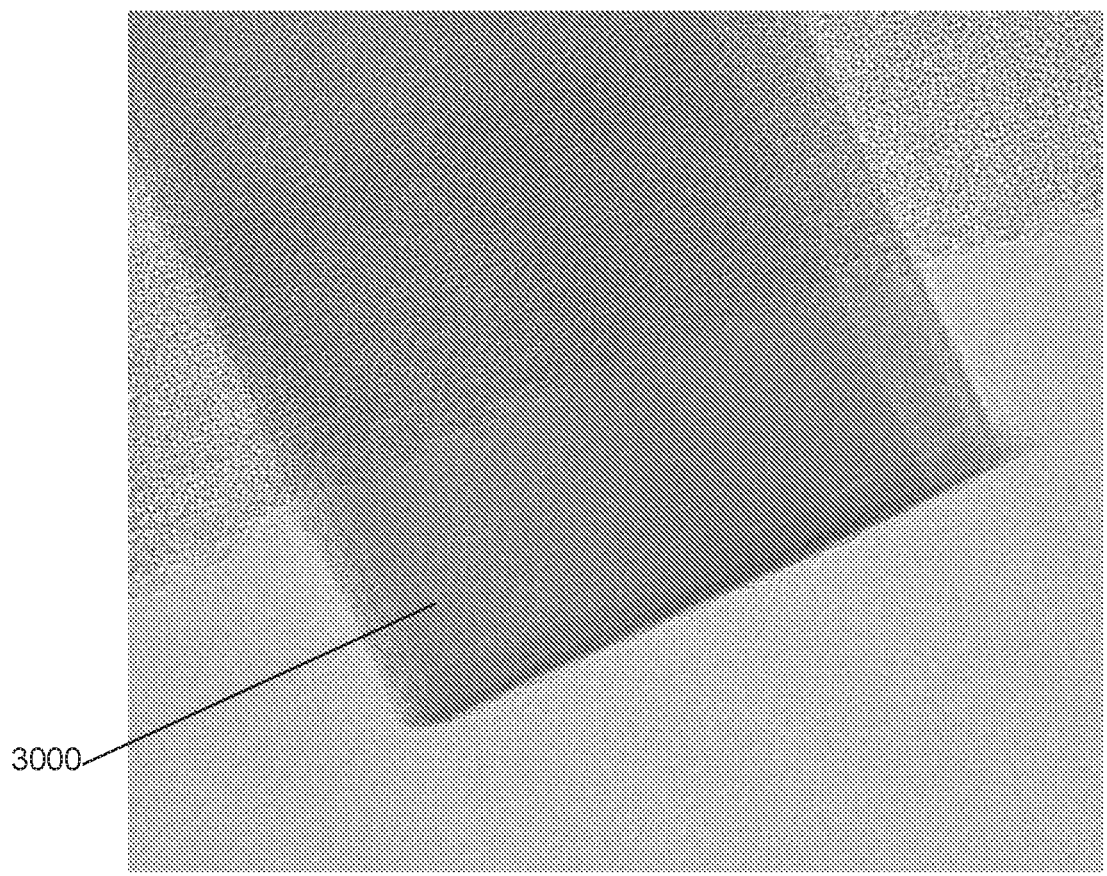
FIG. 30 is a tunneling electron microscope (TEM) image of a nanowire formed in accordance with an implementation of the present teachings.

FIG. 30 is a tunneling electron microscope (TEM) image of a nanowire 3000 formed in accordance with an implementation of the present teachings. The TEM image shows the GaN nanowire as an epitaxial crystal having a width or diameter of about 100 nm after the formation and etching according to an implementation of the present teachings.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or implementations of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. As used herein, the term "one or more of" with respect to a listing of items such as, for example, A and B, means A alone, B alone, or A and B. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated implementation. Finally, "exemplary" indicates the description is used as an example, rather than implying that it is an ideal. Other implementations of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A method for forming a probe for measuring a test sample during microscopy, comprising:
   providing a seed layer on a substrate, wherein the seed layer comprises an epitaxial layer;
   forming a patterned growth mask layer having a hole therein that exposes the seed layer;
   exposing the seed layer to an epitaxial growth environment, thereby growing a nanowire that extends away from the substrate through the hole; and
   providing the nanowire on a flat surface of a cantilever head of a cantilever, wherein the cantilever and the nanowire are part of the probe for measuring the test sample during microscopy.

2. The method of claim 1, further comprising:
   removing the nanowire from the substrate; and
   securing the nanowire to the cantilever head using an electron beam as a localized energy source to form a platinum weld wherein, subsequent to the securing of the nanowire to the cantilever head, the platinum weld physically contacts the nanowire and the flat surface.

3. The method of claim 2, further comprising inserting a first end of the nanowire into a cavity within the flat surface of the cantilever head prior to the securing of the nanowire to the cantilever head using the electron beam.

4. The method of claim 1, further comprising:
   removing the nanowire from the substrate;
   attaching a first end of the nanowire to a first end of an optical fiber; and
   inserting a second end of the optical fiber into a channel that extends through the cantilever head from the flat surface to a back surface of the cantilever head, wherein a second end of the nanowire is configured to extend away from the flat surface of the cantilever head.

5. The method of claim 1, wherein the substrate and the epitaxial layer form a part of the cantilever head, and the growing of the nanowire occurs directly on the cantilever head.

6. The method of claim 1, further comprising:
forming the growth mask on the substrate; and
forming the seed layer within the hole of the patterned growth mask layer.

7. The method of claim 1, wherein:
the providing of the seed layer on the substrate provides a blanket seed layer;
the forming of the patterned growth mask layer forms the patterned growth mask layer to have a plurality of holes therein that expose the seed layer; and
the exposing of the seed layer to the epitaxial growth environment grows a plurality of nanowires that extend away from the substrate through the plurality of holes.

8. The method of any of claim 1, wherein:
the cantilever comprises a cantilever arm that intersects the cantilever head; and
subsequent to the forming of the probe, the nanowire extends from the cantilever head and the nanowire is configured to physically contact a surface of the test sample during a measurement of the surface of the test sample.

9. A method for forming a probe for measuring a test sample during atomic force microscopy, comprising:
providing a silicon cantilever comprising a cantilever head;
removing a portion of the cantilever head to form a flat surface of the cantilever head; and
welding an epitaxial nanowire onto the flat surface of the cantilever head.

10. The method of claim 9, wherein the removing of the portion of the cantilever head to form the flat surface of the cantilever head forms the flat surface at an orientation configured to be parallel to a surface of the test sample during a measurement of the surface of test sample using the probe, wherein the epitaxial nanowire is configured to physically contact the surface of the test sample during the measurement.

11. The method of claim 10, further comprising:
forming a hole in the flat surface of the cantilever head; and
inserting a first end of the epitaxial nanowire into the hole, wherein a second end of the epitaxial nanowire is configured to physically contact the surface of the test sample during the measurement.

12. The method of claim 9, further comprising forming the epitaxial nanowire using a process comprising:
forming a growth mask having an opening therein; and
growing the epitaxial nanowire through the opening in the growth mask, wherein a width of the opening defines a diameter of the epitaxial nanowire.

13. The method of claim 12, wherein the epitaxial nanowire comprises a III N material.

14. The method of claim 13, further comprising growing the epitaxial nanowire to comprise a sharp tip having a radius of 1.0 nanometer or less, wherein the sharp tip is configured to physically contact the test sample during the measurement.

15. The method of claim 13, further comprising growing the epitaxial nanowire to comprise a flat surface, wherein the flat surface of the nanowire is configured to physically contact the test sample during the measurement.

16. A method for forming a probe for measuring a test sample during microscopy, comprising:
providing an epitaxial layer on a substrate;
forming a patterned etch mask layer over the epitaxial layer;
anisotropically etching the epitaxial layer using the patterned etch mask as a pattern to result in a nanowire that extends away from the substrate; and
providing the nanowire on a flat surface of a cantilever head of a cantilever, wherein the cantilever and the nanowire are part of the probe for measuring the test sample during microscopy.

17. The method of claim 16, further comprising:
removing the nanowire from the substrate; and
inserting a first end of the nanowire into a cavity within the flat surface of the cantilever head, wherein a second end of the nanowire extends away from the flat surface.

18. The method of claim 16, further comprising:
removing the nanowire from the substrate;
attaching a first end of the nanowire to a first end of an optical fiber; and
inserting a second end of the optical fiber into a channel that extends through the cantilever head from the flat surface to a back surface of the cantilever head, wherein a second end of the nanowire is configured to extend away from the flat surface of the cantilever head.

19. The method of claim 16, wherein the substrate and the epitaxial layer form a part of the cantilever head, and the anisotropically etching of the nanowire occurs directly on the cantilever head.

20. The method of claim 16, wherein:
the cantilever comprises a cantilever arm that intersects the cantilever head; and
subsequent to the forming of the probe, the nanowire extends from the cantilever head and the nanowire is configured to physically contact a surface of the test sample during a measurement of the surface of the test sample.

21. A probe for measuring a test sample during atomic force microscopy (AFM), comprising:
a probe head comprising a substrate having a surface, wherein the substrate comprises a cavity therein extending through the surface; and
a nanowire comprising a first end and a second end, wherein:
the first end of the nanowire extends into the cavity within the substrate of the probe head; and
the second end of the nanowire is configured to physically contact a surface of the test sample during a measurement of the test sample.

22. The probe of claim 21, wherein the nanowire is an epitaxial crystal comprising one or more of gallium nitride, aluminum nitride, indium nitride, an alloy of gallium nitride, an alloy of aluminum nitride, and an alloy of indium nitride.

23. The probe of claim 21, wherein the nanowire has a length from the first end to the second end of from 100 nanometers (nm) to 10 micrometers ($\mu$m), and a width of from 10 nm to 100 nm.

24. The probe of claim 21, wherein the substrate comprises one or more of silicon, silicon carbide, and aluminum oxide.

25. A probe for measuring a test sample during atomic force microscopy (AFM), comprising:
a probe head comprising a substrate having a surface, wherein the substrate comprises a cavity therein extending through the surface;

an optical fiber comprising a first end and a second end, wherein the second end of the optical fiber extends into the cavity within the surface of the probe head; and a nanowire comprising a first end and a second end, wherein:

the first end is attached to the first end of the optical fiber; and the second end of the nanowire is configured to physically contact a surface of the test sample during a measurement of the test sample.

26. The probe of claim 25, wherein the nanowire is an epitaxial crystal comprising one or more of gallium nitride, aluminum nitride, and indium nitride.

27. The probe of claim 25, wherein:

the nanowire has a length from the first end to the second end of from 100 nanometers (nm) to 10 micrometers (μm), and a width of from 10 nm to 100 nm; and the substrate comprises one or more of silicon, silicon carbide, and aluminum oxide.

* * * * *